United States Patent
Yang et al.

(10) Patent No.: US 11,521,847 B2
(45) Date of Patent: Dec. 6, 2022

(54) HYDROGEN ASSISTED ATMOSPHERIC RADICAL OXIDATION

(71) Applicants: Mattson Technology, Inc., Fremont, CA (US); Beijing E-Town Semiconductor Technology Co., Ltd., Beijing (CN)

(72) Inventors: Michael X. Yang, Palo Alto, CA (US); Christian Pfahler, Ulm (DE); Alexandr Cosceev, Lonsee (DE)

(73) Assignees: BEIJING E-TOWN SEMICONDUCTOR TECHNOLOGY CO., LTD., Beijing (CN); MATTSON TECHNOLOGY, INC., Fremont, CA (US)

( * ) Notice: Subject to any disclaimer, the term of this patent is extended or adjusted under 35 U.S.C. 154(b) by 157 days.

(21) Appl. No.: 16/861,345

(22) Filed: Apr. 29, 2020

(65) Prior Publication Data

US 2020/0350158 A1     Nov. 5, 2020

Related U.S. Application Data

(60) Provisional application No. 62/840,757, filed on Apr. 30, 2019.

(51) Int. Cl.
*H01L 21/02*     (2006.01)
*H01L 21/67*     (2006.01)

(52) U.S. Cl.
CPC .. *H01L 21/02238* (2013.01); *H01L 21/67109* (2013.01)

(58) Field of Classification Search
CPC ......... H01L 21/02238; H01L 21/67109; H01L 21/02255; H01L 21/67017;
(Continued)

(56) References Cited

U.S. PATENT DOCUMENTS 5,633,212 A * 5/1997 Yuuki ............... H01L 21/02238
                                                     257/E21.285
6,037,273 A     3/2000   Gronet et al.
(Continued)

FOREIGN PATENT DOCUMENTS

EP           1104012       12/2008
JP          2009-191331     8/2009

OTHER PUBLICATIONS

PCT International Search Report and Written Opinion for corresponding PCT Application No. PCT/US2020/030422, dated Jul. 30, 2020, 9 pages.
(Continued)

*Primary Examiner* — Mohammed Shamsuzzaman
(74) *Attorney, Agent, or Firm* — Dority & Manning, P.A.

(57) ABSTRACT

Apparatus, systems, and methods for processing workpieces are provided. In one example implementation, a hydrogen gas mixed with an inert gas can be reacted with an oxygen gas to oxidize a workpiece at atmospheric pressure. A chemical reaction of a hydrogen gas with an oxygen gas facilitated by a hot workpiece surface can positively affect an oxidation process. A reaction speed of the chemical reaction can be slowed down by mixing the hydrogen gas with an inert gas. Such mixture can effectively reduce a partial pressure of the hydrogen gas. As such, the oxidation process can be carried out at atmospheric pressure, thereby, in an atmospheric thermal processing chamber.

10 Claims, 5 Drawing Sheets

(58) Field of Classification Search
CPC ........... H01L 21/67115; H01L 21/6719; H01L 21/02164; H01L 21/67098
See application file for complete search history.

(56) References Cited

U.S. PATENT DOCUMENTS

| | | | | |
|---|---|---|---|---|
| 6,114,258 | A * | 9/2000 | Miner | H01L 21/022 438/770 |
| 6,458,714 | B1 * | 10/2002 | Powell | H01L 21/3003 438/770 |
| 6,465,352 | B1 * | 10/2002 | Aoki | H01L 21/76802 257/E21.255 |
| 6,797,323 | B1 * | 9/2004 | Kashiwagi | H01L 21/02255 257/E21.285 |
| 7,799,685 | B2 * | 9/2010 | Savas | H01L 21/02063 438/689 |
| 9,595,449 | B1 * | 3/2017 | Jagannathan | H01L 21/3105 |
| 10,800,092 | B1 * | 10/2020 | Cheng | H05H 1/2406 |
| 2002/0192885 | A1 * | 12/2002 | Miyasaka | H01L 29/66757 438/164 |
| 2003/0013280 | A1 * | 1/2003 | Yamanaka | H01L 21/02529 257/E29.294 |
| 2004/0042307 | A1 * | 3/2004 | Ohmi | H01L 27/11546 257/E29.151 |
| 2004/0051153 | A1 * | 3/2004 | Yamamoto | H01L 21/324 257/E21.654 |
| 2004/0063276 | A1 * | 4/2004 | Yamamoto | H01L 21/28176 257/E21.654 |
| 2005/0186341 | A1 * | 8/2005 | Hendrix | C23C 16/16 427/248.1 |
| 2006/0223315 | A1 | 10/2006 | Yokota et al. | |
| 2008/0124943 | A1 * | 5/2008 | Yuasa | H01L 21/02238 257/E21.24 |
| 2008/0289650 | A1 * | 11/2008 | Arena | C23C 16/0236 134/1 |
| 2009/0081884 | A1 | 3/2009 | Yokota et al. | |
| 2010/0163179 | A1 * | 7/2010 | Tozawa | H01L 29/165 156/345.1 |
| 2011/0065286 | A1 * | 3/2011 | Sasaki | H01L 21/02238 438/770 |
| 2012/0043644 | A1 * | 2/2012 | Ono | C30B 23/025 117/106 |
| 2014/0034632 | A1 * | 2/2014 | Pan | H01L 21/02252 219/520 |
| 2014/0099797 | A1 * | 4/2014 | Terasaki | C23C 16/56 438/787 |
| 2015/0357184 | A1 * | 12/2015 | Jongbloed | H01L 21/02164 438/770 |
| 2017/0323785 | A1 * | 11/2017 | Singhal | H01L 21/0228 |

OTHER PUBLICATIONS

A Chinese Office Action from Application No. CN 22080004319.5 dated Dec. 3, 2021. (6 pages).

* cited by examiner

HYDROGEN ASSISTED ATMOSPHERIC RADICAL OXIDATION

PRIORITY CLAIM

The present application claims the benefit of priority of U.S. Provisional Application Ser. No. 62/840,757, titled "Hydrogen Assisted Atmospheric Radical Oxidation," filed on Apr. 30, 2019, which is incorporated herein by reference.

FIELD

The present disclosure relates generally to processing semiconductor workpieces.

BACKGROUND

Many semiconductor processes (e.g., oxidation processes) require a workpiece (e.g., semiconductor wafer) to be heated to high temperatures so that various chemical and physical transformations can take place as the workpiece is fabricated into a device(s). During rapid thermal processing, for instance, semiconductor wafers can be heated by an array of lamps through the support plate to temperatures from about 300° C. to about 1,200° C., for times that are typically less than a few minutes.

SUMMARY

Aspects and advantages of the disclosure will be set forth in part in the following description or may be learned through practice of the disclosure.

One example aspect of the present disclosure is directed to a method for processing a workpiece. The method can include placing the workpiece in a thermal processing chamber. The method can include admitting a first gas into the thermal processing chamber at a first flow rate. The thermal processing chamber can be at approximately atmospheric pressure. The first gas can include a mixture of an inert gas and a hydrogen gas, and a concentration of the hydrogen gas in the mixture can be less than about 4% by volume. The method can include heating the workpiece in the thermal processing chamber with one or more heat sources. The method can include exposing the workpiece to the first gas in the thermal processing chamber at approximately atmospheric pressure. The first flow rate can be such that a partial pressure of the hydrogen gas in the thermal processing chamber is less than about 10 Torr.

Another example aspect of the present disclosure is directed to a thermal processing apparatus. The thermal processing apparatus can include a thermal processing chamber configured to be maintained at approximately atmospheric pressure. The thermal processing apparatus can include a workpiece support configured to support a workpiece in the thermal processing chamber during a thermal process. The thermal processing apparatus can include one or more heat sources configured to heat the workpiece during the thermal process. The thermal processing apparatus can include a gas supply. The gas supply can include a first gas line configured to admit a forming gas into the thermal processing chamber at a first flow rate. The forming gas can include a mixture of an inert gas and a hydrogen gas. A concentration of the hydrogen gas in the mixture can be less than about 4% by volume. The first flow rate can be such that a partial pressure of the hydrogen gas in the thermal processing chamber is less than about 10 Torr. The workpiece can be exposed to the forming gas at approximately atmospheric pressure.

Variations and modifications can be made to example embodiments of the present disclosure.

These and other features, aspects and advantages of the present disclosure will become better understood with reference to the following description and appended claims. The accompanying drawings, which are incorporated in and constitute a part of this specification, illustrate embodiments of the disclosure and, together with the description, serve to explain the principles of the disclosure.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
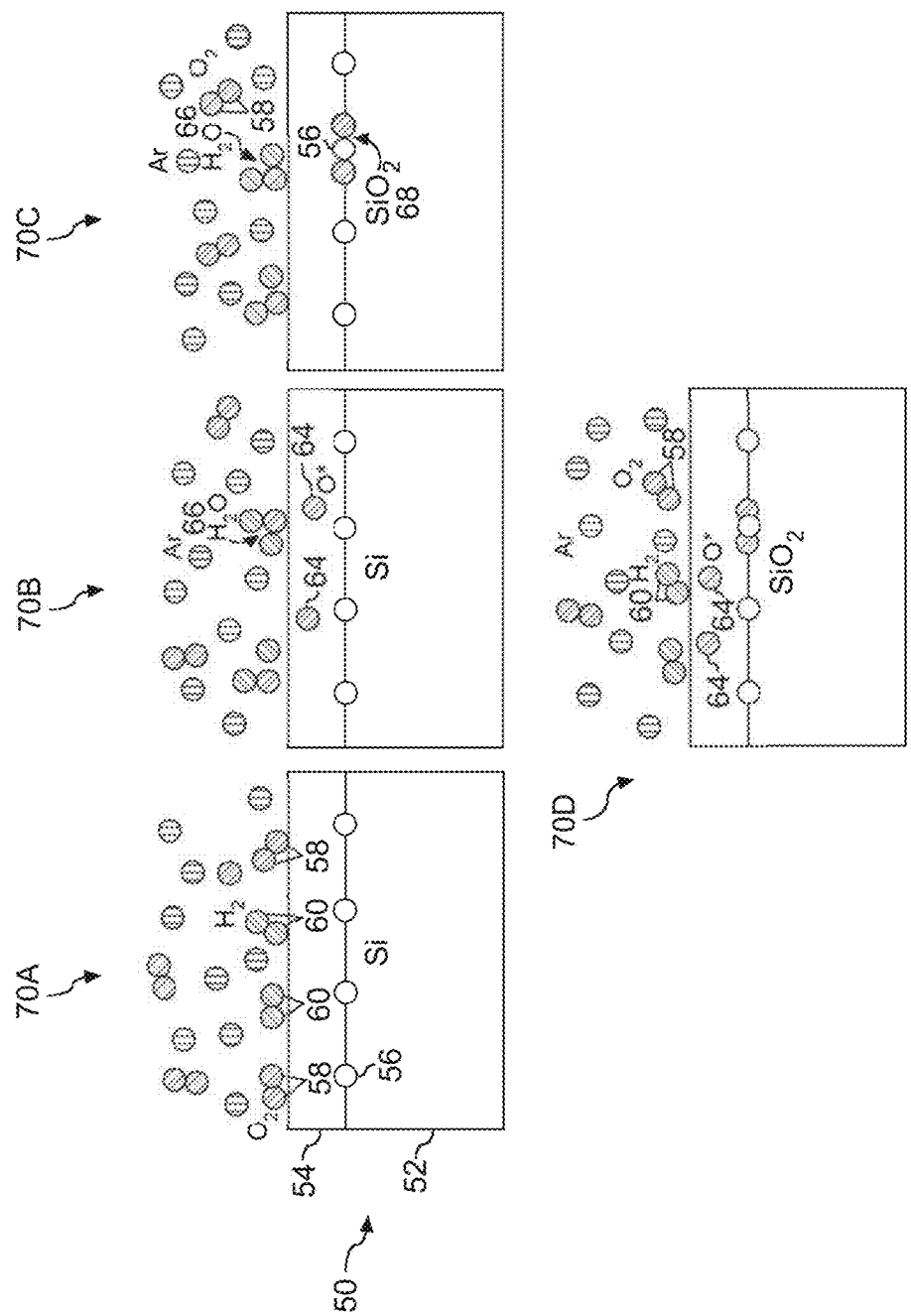
FIG. 1 depicts an example oxidation process on a structure according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods and apparatuses for processing a workpiece (e.g., a semiconductor wafer, or a silicon and/or a silicon containing structure) to at least partially oxidize a portion of the workpiece. Oxidation processes (e.g., oxidation processes in a rapid thermal processing apparatus) can sometimes implicate safety issues. For instance, a hydrogen gas and an oxygen gas can be reacted at a workpiece surface to reduce an oxidation temperature and to improve an oxide quality. However, a hydrogen gas can be flammable and can raise safety issues when the hydrogen gas is mixed with air and oxygen gas.

According to example aspects of the present disclosure, a hydrogen gas mixed with an inert gas (also referred as to a carrier gas, e.g., argon, helium, xenon, neon, or nitrogen) can be reacted with an oxygen gas to oxidize a workpiece at atmospheric pressure. Nitrogen gas ($N_2$) is included as an example of an inert gas for purposes of the present disclosure. A chemical reaction of a hydrogen gas with an oxygen gas facilitated by a heated workpiece surface can positively affect an oxidation process. A reaction speed of the chemical reaction can be slowed down by mixing the hydrogen gas with an inert gas. Such mixture can effectively reduce a partial pressure of the hydrogen gas. As such, the oxidation process can be carried out at atmospheric pressure, thereby, in an atmospheric thermal processing chamber.

In some embodiments, in addition to the partial pressure of the hydrogen gas, gas distribution and oxidation temperature can positively affect the oxidation process. For instance, in addition to the partial pressure of the hydrogen gas, gas flows onto the workpiece surface can be implemented with high velocities along different directions (e.g., perpendicular and/or parallel relative to the workpiece surface) to affect a surface boundary layer thickness of the workpiece. Additionally, the oxidation temperature can be used to affect a growth rate and an oxide quality of the oxidation process. As such, conformity and selectivity of a resulting oxide layer can be controlled.

One example aspect of the present disclosure is directed to a method for processing a workpiece. The method can include placing the workpiece in a thermal processing chamber. The method can include admitting a forming gas (e.g., a mixture of an inert gas and a hydrogen gas) and an oxygen containing gas (e.g., oxygen gas, or gas containing oxygen) into the thermal processing chamber. The method can include heating the workpiece in the thermal processing chamber with one or more heat sources. The method can include exposing the workpiece to the forming gas and the oxygen containing gas in the thermal processing chamber at approximately atmospheric pressure while heating the workpiece to at least partially oxidize a portion of the workpiece.

According to one example aspect of the present disclosure, the workpiece can be placed on a support plate in the thermal processing chamber. The thermal processing chamber can be an atmospheric thermal processing chamber that can be operable at approximately atmospheric pressure. For instance, the thermal processing chamber is part of a rapid thermal processing (RTP) system as further described below.

According to one example aspect of the present disclosure, the forming gas can be a mixture of a hydrogen gas mixed with an inert gas. For instance, a concentration of a hydrogen gas in a mixture of the hydrogen gas and a nitrogen gas can be less than about 4% by volume. A concentration of a hydrogen gas in a mixture of the hydrogen gas and an argon gas can be less than about 3% by volume. As such, a concentration of a hydrogen gas in a mixture can be kept below a flammability limit. As a result, an oxidation process based on a hydrogen gas mixed with an inert gas can be performed at atmospheric pressure.

In some embodiments, partial pressures of reactants in the thermal processing chamber can be adjusted based on flow rates among the forming gas, the oxygen containing gas, and/or a dilution gas (e.g., an inert gas). For instance, the forming gas can be admitted into the thermal processing chamber at a flow rate such that a partial pressure of the hydrogen gas can be less than about 10 Torr. The oxygen containing gas can be admitted into the thermal processing chamber at a flow rate such that a partial pressure of the oxygen containing gas can be in a range of about 30 Torr to about 50 Torr. The dilution gas can be an inert gas to dilute both the forming gas and the oxygen gas.

For example, to achieve a partial pressure of about 40 Torr oxygen ($O_2$) and about 10 Torr hydrogen ($H_2$) mixed with a nitrogen ($N_2$) atmosphere with a total flow rate of about 24 standard litre per minute (slm), example flow rates for one example implementation according to example embodiments of the present disclosure are provided below:

| | Forming gas (4% $H_2$ in $N_2$) | Oxygen ($O_2$) | Dilution gas (e.g. Nitrogen $N_2$) |
|---|---|---|---|
| Desired partial pressures | 10 Torr 4% $H_2$ (250 Torr $H_2/N_2$) | 40 Torr $O_2$ | 470 Torr $N_2$ |
| Required flow rates | 7.9 slm $H_2/N_2$ | 1.3 slm $O_2$ | 14.8 slm $N_2$ |

In some embodiments, to provide increased reactants that are supplied to a workpiece surface in the oxidation process, a total flow rate can be adjusted to be less than about 350 slm that is much greater than a typical flow rate (e.g., about 25 slm) in a standard rapid thermal oxidation process.

In some embodiments, the dilution gas can be an inert gas that is the same as the one in the forming gas. For instance, an argon gas or a nitrogen gas can be used in both the forming gas and the dilution gas. In some embodiments, the dilution gas can be different from the inert gas in the forming gas. For instance, an argon gas can be used in the forming gas, and a nitrogen gas can be used in the dilution gas, or vice versa. In some embodiments, without the dilution gas, only forming gas and oxygen containing gas can be admitted into the thermal processing chamber.

In some embodiments, in addition to the forming gas and the oxygen containing gas, the method can include admitting an additional gas into the thermal processing chamber. For instance, the additional gas can be an ammonia gas.

In some embodiments, the forming gas can be a pre-mixed gas. For instance, a hydrogen gas and an oxygen containing gas can be mixed prior to being admitted into the thermal processing chamber. In some embodiments, the forming gas can be formed in the thermal processing chamber. For instance, a hydrogen gas and an oxygen containing gas can be independently admitted into the thermal processing chamber at different flow rates to achieve respective partial pressures.

In some embodiments, the forming gas, the oxygen containing gas, the dilution gas, and/or the additional gas can be admitted into the thermal processing chamber along different gas flow directions, e.g., in a gas flow direction perpendicular to the workpiece, in a gas flow direction parallel to the workpiece, or in a combination thereof. As such, supply of reactants can be adjusted to flow into deeper trenches and/or to effectively remove reaction byproducts.

According to one example aspect of the present disclosure, the method can include heating the workpiece in the thermal processing chamber with one or more heat sources. A heat source can be a lamp, a flash lamp, an arc lamp, a laser, a plasma heat source, a pulsed heat source or any other suitable heat source that heats the workpiece.

In some embodiments, the thermal processing chamber can include heat sources arranged to heat both sides of the workpiece (e.g., a first surface and an opposing second surface). For instance, different areas and structures on a workpiece can absorb energy in a different way. Varying local temperatures can occur, impacting local oxide growth rates. Heating the workpiece from front and backside with different, adjustable power ratios can reduce local temperature differences and can reduce negative effects (e.g., workpiece warpage).

According to one example aspect of the present disclosure, the method can include exposing the workpiece to the forming gas and the oxygen containing gas in the thermal processing chamber at approximately atmospheric pressure while heating the workpiece to at least partially oxidize a portion of the workpiece. For instance, a reaction between the forming gas and the oxygen containing gas can be facilitated by a heated workpiece. At the heated workpiece surface, hydrogen from the forming gas can react with an oxygen molecule to leave an oxygen radical. Due to the inert gas in the forming gas and/or the dilution gas, a recombination of two oxygen radicals to an oxygen molecule can be delayed. An oxygen radical can have a higher probability to diffuse to an oxide bulk interface to react with a silicon atom than with another oxygen radical. Additionally, some of the oxygen radicals can react with hydrogen to generate water vapor. Previously formed water vapor can dissociate at the heated workpiece surface to act as an additional source for oxygen radicals diffusing to the oxide bulk interface. Since the reaction is carried out at atmospheric pressure, without affecting (e.g., increasing) a mean free path of the reactants in a gas phase, probability of finding a reaction partner can be reduced.

In some embodiments, the forming gas can use a nitrogen as carrier gas. Presence of hydrogen molecules and radicals can have an additional effect of promoting nitrogen diffusion. As such, oxynitride can be formed during an oxide growth.

Another example aspect of the present disclosure is directed to a thermal processing apparatus for thermal processing a workpiece. The thermal processing apparatus can include a thermal processing chamber being at approximately atmospheric pressure. The thermal processing apparatus can include a workpiece support to support a workpiece in the thermal processing chamber during a thermal process. The thermal processing apparatus can include one or more heat sources to heat the workpiece during the thermal process. The thermal processing apparatus can include a gas supply. The gas supply can include a first gas line configured to admit a forming gas into the thermal processing chamber at a first flow rate. The forming gas can include a mixture of an inert gas and a hydrogen gas. A concentration of the hydrogen gas in the mixture can be less than about 4% by volume. The first flow rate can be such that a partial pressure of the hydrogen gas in the thermal processing chamber is less than about 10 Torr. The workpiece can be exposed to the forming gas at approximately atmospheric pressure.

In some embodiments, the gas supply can further include a second gas line to admit an oxygen gas into the thermal processing chamber at a second flow rate. The workpiece can be exposed to the oxygen gas in the thermal processing chamber at approximately atmospheric pressure while the one or more heat sources are heating the workpiece such that the forming gas and the oxygen gas can at least partially oxidize a portion of the workpiece. In some embodiments, the second flow rate can be such that a partial pressure of the oxygen in the thermal process chamber is in a range of about 30 Torr to about 50 Torr. In some embodiments, the gas supply can include a third gas line to admit a dilution gas into the thermal processing chamber. The dilution gas can dilute the forming gas and the oxygen gas. The dilution gas can be different from or the same as the inert gas in the forming gas. In some embodiments, the gas supply can include a fourth gas line to admit an ammonia gas or other gas into the thermal processing chamber. In some embodiments, a concentration of a hydrogen gas in a mixture of the hydrogen gas mixed with an argon gas can be less than about 3% by volume. A concentration of a hydrogen gas in a mixture of the hydrogen gas mixed with a nitrogen gas can be less than about 4% by volume. In some embodiments, the gas supply can include a gas flow plate located above the workpiece in the thermal processing chamber such that the forming gas is admitted in a gas flow direction perpendicular to and/or parallel to the workpiece.

Example aspects of the present disclosure provide a number of technical effects and benefits. For instance, a hydrogen gas mixed with an inert gas can be reacted with an oxygen gas to oxidize a workpiece at atmospheric pressure. A reaction speed of the reaction can be slowed down by mixing a hydrogen gas with an inert gas. Such mixture can effectively reduce a partial pressure of the hydrogen gas. As such, the oxidation process can be carried out at atmospheric pressure without affecting (e.g., increasing) a mean free path of the reactants in a gas phase. This can reduce the probability of finding a reaction partner and conformity and selectivity of a resulting oxide layer can be controlled.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" or "approximately" in conjunction with a numerical value or other value is intended to refer to within ten percent (10%) of the stated numerical value. A "pedestal" refers to any structure that can be used to support a workpiece.

With reference now to the FIGS., example embodiments of the present disclosure will now be discussed in detail. FIG. 1 depicts an example oxidation process on a structure 50 according to example embodiments of the present disclosure. The structure 50 includes a silicon wafer 52 and an oxide bulk interface 54. The oxide bulk interface 54 is an interface between the silicon wafer 52 and gases, where silicon oxidation reaction occurs. As can be seen at 70A and 70B, a hydrogen gas mixed with an argon gas, and an oxygen gas are delivered onto the silicon wafer 52. Oxygen molecules ($O_2$) 58, hydrogen molecules ($H_2$) 60, and argon (Ar) molecules marked with circles having vertical lines are dissociated at the oxide bulk interface 54. Some oxygen radicals (e.g., oxygen radicals 64) diffuse into the oxide bulk interface 54. Some oxygen radicals react with hydrogen molecules to generate a water vapor 66. Presence of the argon molecules can reduce a probability of a recombination reaction between oxygen radicals. As can be seen at 70C, the oxygen radicals 64 react with silicon molecules 56 of the silicon wafer 52 to form silicon dioxide 68. As can be seen at 70D, previously formed water vapor 66 is again dissociating at the oxide bulk interface 54 acting as an additional source to form the oxygen radicals 64 diffusing into the oxide bulk interface 54 to oxidize the silicon molecules 56. Since the reaction is carried out at atmospheric pressure, without affecting (e.g., increasing) a mean free path of the reactants in a gas phase, probability of finding a reaction partner can be reduced.

In some embodiments (not shown in FIG. 1), a hydrogen gas can be mixed with a nitrogen gas. Presence of hydrogen molecules and radicals can have an additional effect of promoting nitrogen diffusion. As such, oxynitride can be formed during an oxide growth.

Figure 2:
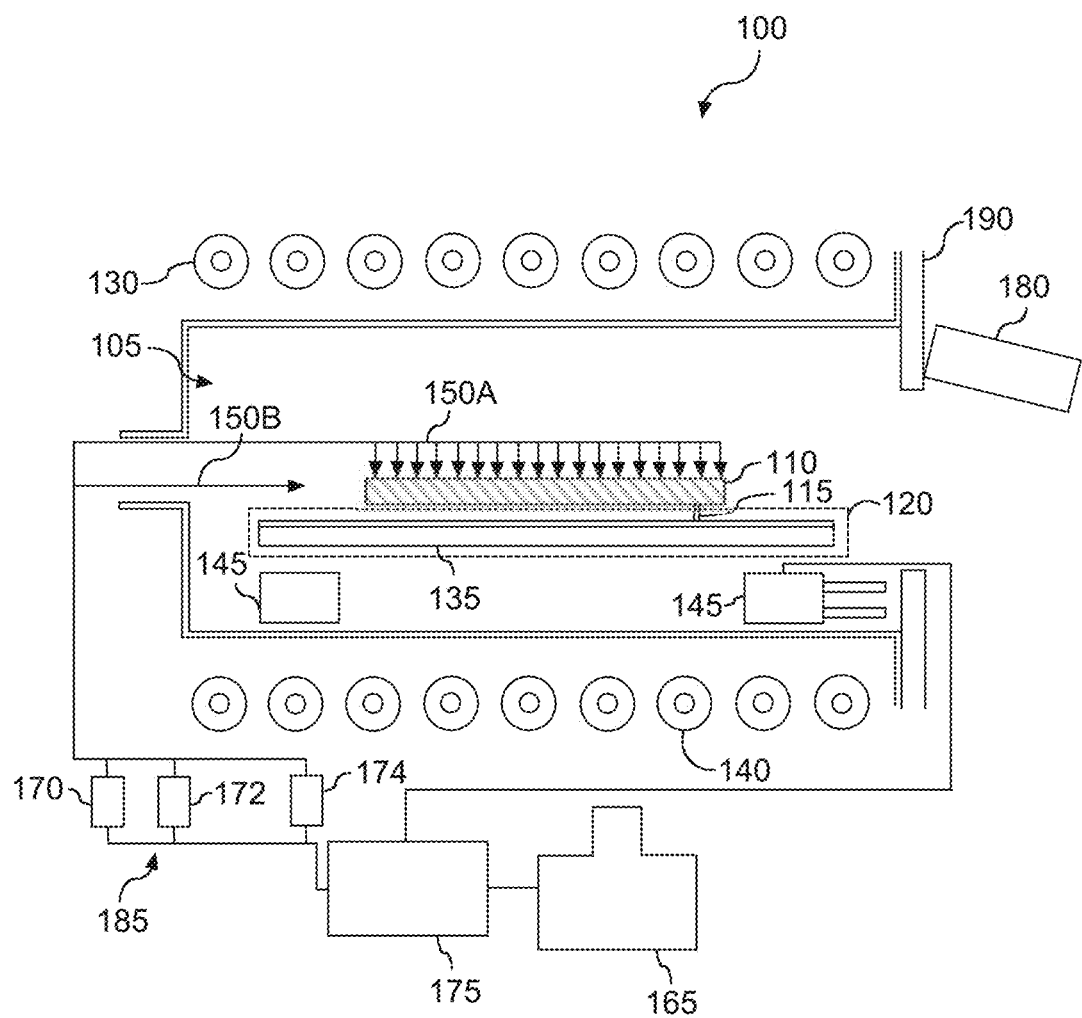
FIG. 2 depicts an example rapid thermal processing (RTP) system according to example embodiments of the present disclosure.

FIG. 2 depicts an example rapid thermal processing (RTP) system 100 according to example embodiments of the present disclosure. As illustrated, the RTP system 100 includes a thermal processing chamber 105, a workpiece 110, a support plate 120, heat sources 130 and 140, air bearings 145, a pyrometer 165, a controller 175, a door 180, and a gas supply 185.

The workpiece 110 to be processed is supported in the thermal processing chamber 105 (e.g., a quartz RTP chamber) by the support plate 120. The support plate 120 (e.g., quartz support plate) supports the workpiece 110 during thermal processing. Examples of the support plate 120 can include one or more support pins, a ring support, or any other suitable support that contacts and supports a workpiece. As shown in FIG. 2, the support plate 120 includes one or more support pins 115 (only one shown). The support plate 120 can transmit heat from the heat sources 140 and can absorb heat from the workpiece 110. In some embodiments, the support plate 120 can be made of quartz. In some embodiments, the support plate 120 can include a rotatable base 135 that rotates the workpiece 110 at a defined rotation orientation and at a defined rotation speed. An end plate 190 seals to the thermal processing chamber 105, and the door 180 allows entry of the workpiece 110 and, when closed, allows the thermal processing chamber 105 to be sealed. Two banks of heat sources 130 (e.g., lamps, flash lamps, arc lamps, laser, pulsed heat sources, or other suitable heat sources) and 140 are shown on either side of the workpiece 110. The controller 175 (e.g., a computer, microcontroller(s), other control device(s), etc.) can be used to control the heat sources 130 and 140. The controller 175 can be used to control the gas supply 185, the door 180, and/or the temperature measuring system, denoted here as the pyrometer 165.

As shown in FIG. 2, according to example aspects of the present disclosure, the RTP system 100 includes a gas supply 150 to deliver a forming gas (e.g., a mixture of a hydrogen gas mixed with an inert gas), an oxygen containing gas (e.g., an oxygen gas), and a dilution gas (e.g., an inert gas) into the thermal processing chamber 105. The gas supply 185 can include a plurality of feed gas lines. Each feed gas line can be controlled using valves and/or mass flow controllers (not shown in FIG. 2) to deliver a desired amount of gases into the thermal processing chamber 105. As shown in FIG. 2, the gas supply 150 includes feed gas line(s) 170 for delivery of the forming gas, feed gas line(s) 172 for delivery of the oxygen containing gas, feed gas line(s) 174 for delivery of the dilution gas. A control valve and/or mass flow controller (not shown in FIG. 2) can be used to control a flow rate of each feed gas line to flow a respective gas into the thermal processing chamber 105.

In some embodiments, a concentration of a hydrogen gas in a mixture of the hydrogen gas mixed with a nitrogen gas can be less than about 4% by volume. A concentration of a hydrogen gas in a mixture of the hydrogen gas mixed with an argon gas can be less than about 3% by volume. An example of a gas can be Varigon H2 gas available from Linde AG. As such, a concentration of a hydrogen gas in a mixture can be kept below a flammability limit. As a result, an oxidation process based on a hydrogen gas mixed with an inert gas can be implemented atmospheric pressure.

In some embodiments, partial pressures of reactants in the thermal processing chamber 105 can be adjusted based on flow rates among the forming gas, the oxygen containing gas, and/or a dilution gas (e.g., an inert gas). For instance, the forming gas can be admitted into the thermal processing chamber 105 at a flow rate such that a partial pressure of the hydrogen gas can be less than about 10 Torr. The oxygen containing gas can be admitted into the thermal processing chamber 105 at a flow rate such that a partial pressure of the oxygen containing gas can be in a range of about 30 Torr to about 50 Torr. The dilution gas can be an inert gas to dilute both the forming gas and the oxygen gas.

In some embodiments, to provide increased reactants that are supplied to a workpiece surface in the oxidation process, a total flow rate can be adjusted to be less than about 350 slm that is much greater than a typical flow rate (e.g., about 25 slm) in a standard rapid thermal oxidation process.

In some embodiments, the dilution gas can be an inert gas that is the same as the one in the forming gas. For instance, an argon gas or a nitrogen gas can be used in both the forming gas and the dilution gas. In some embodiments, the dilution gas can be different from the inert gas in the forming gas. For instance, an argon gas can be used in the forming gas, and a nitrogen gas can be used in the dilution gas, or vice versa. In some embodiments, without the dilution gas, only forming gas and oxygen containing gas can be admitted into the thermal processing chamber.

In some embodiments (not shown in FIG. 2), the gas supply 150 can further include feed gas line(s) for delivery of an additional gas (e.g., ammonia gas) into the thermal processing chamber 105.

As shown in FIG. 2, according to example aspects of the present disclosure, the gas supply 150 can deliver the forming gas, the oxygen containing gas, the dilution gas, and/or the additional gas into the thermal processing chamber 105 along different gas flow directions, e.g., in a gas flow direction 150A perpendicular to the workpiece, in a gas flow direction parallel 150B to the workpiece, or in a combination thereof. As such, supply of reactants can be adjusted to flow into deeper trenches and/or to effectively remove reaction byproducts.

In some embodiments (not shown in FIG. 2), the gas supply 150 can include a gas flow plate located above the workpiece 110 in the thermal processing chamber 105 such that the forming gas, the oxygen containing gas, the dilution gas, and/or the additional gas can be admitted into the thermal processing chamber 105 in a gas flow direction 150A perpendicular to the workpiece 110.

Figure 3:
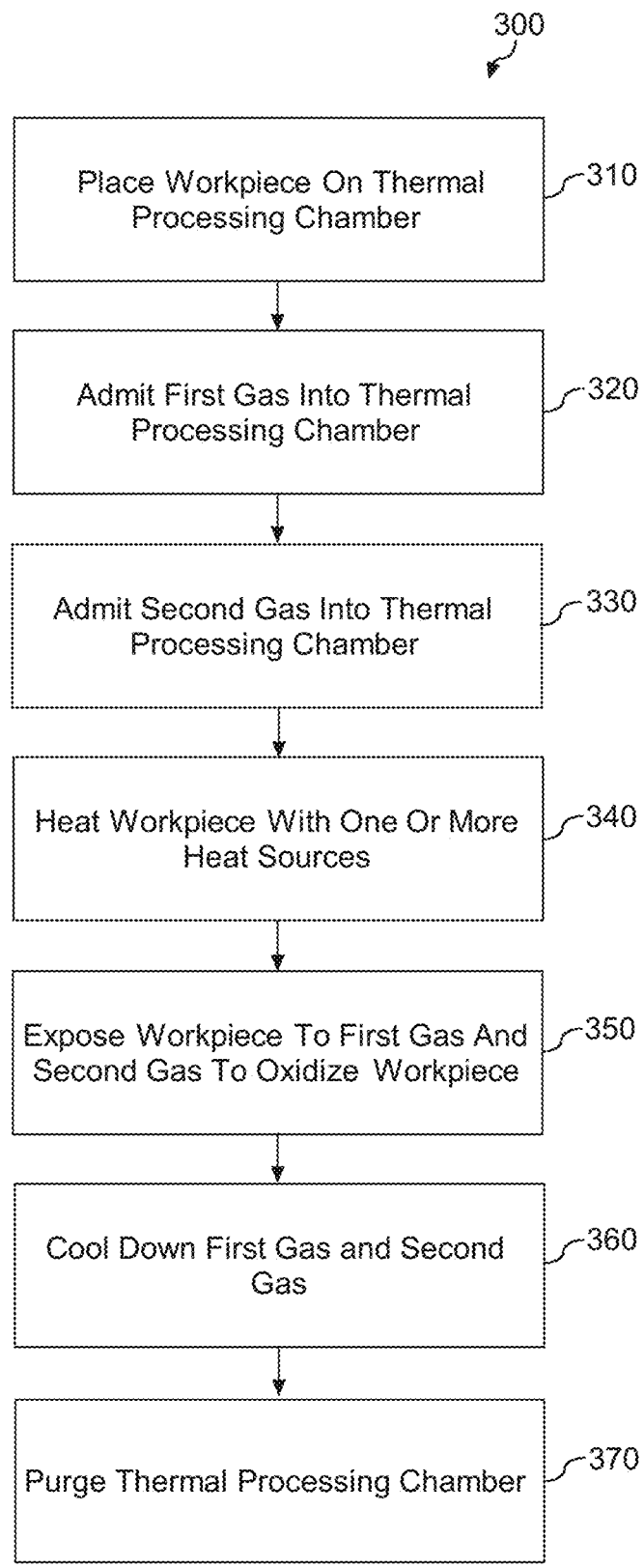
FIG. 3 depicts a flow diagram of an example method according to example embodiments of the present disclosure.

FIG. 3 depicts a flow diagram of an example method (300) according to example embodiments of the present disclosure. The method (300) will be discussed with reference to the RTP system 100 of FIG. 3 by way of example. The method (300) can be implemented in any suitable thermal processing apparatus. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (310), the method can include placing a workpiece on a workpiece support in a thermal processing chamber. For instance, a workpiece 110 can be placed on a workpiece support plate 120 in a thermal processing chamber 105. The thermal processing chamber 105 can be an atmospheric thermal processing chamber that can work at approximately atmospheric pressure.

At (320), the method can include admitting a first gas (e.g., a forming as) into the thermal processing chamber. For instance, the forming gas can include a mixture of a hydrogen gas mixed with an inert gas (e.g. argon or nitrogen). The gas supply 150 can deliver the forming gas via feed gas line(s) 170 into the thermal processing chamber 105 in a gas flow direction 150A perpendicular to the workpiece, and/or in a gas flow direction parallel 150B.

At (330), the method can include admitting a second gas (e.g., an oxygen containing gas) into the thermal processing chamber. For instance, the gas supply 150 can deliver the oxygen containing gas via feed gas line(s) 172 into the thermal processing chamber 105 in a gas flow direction 150A perpendicular to the workpiece, and/or in a gas flow direction parallel 150B.

At (340), the method can include heating the workpiece with one or more heat resources. For instance, the heat sources 130 and 140 can heat the workpiece 110 to a temperature such that oxidation process can occur.

At (350), the method can include exposing the workpiece to the first gas and the second gas to oxidize the workpiece. For instance, the workpiece 110 can be exposed to the forming gas and the oxygen containing gas at approximately atmospheric pressure to oxidize the workpiece 110.

At (360), the method can include cooling down the first gas and the second gas. For instance, the forming gas and the oxygen containing gas can be cooled down in the rapid thermal processing (RTP) system 100.

At (370), the method can include purging the thermal processing chamber. For instance, the thermal processing chamber 105 can be purged to be ready for the next workpiece to be processed.

Figure 4:
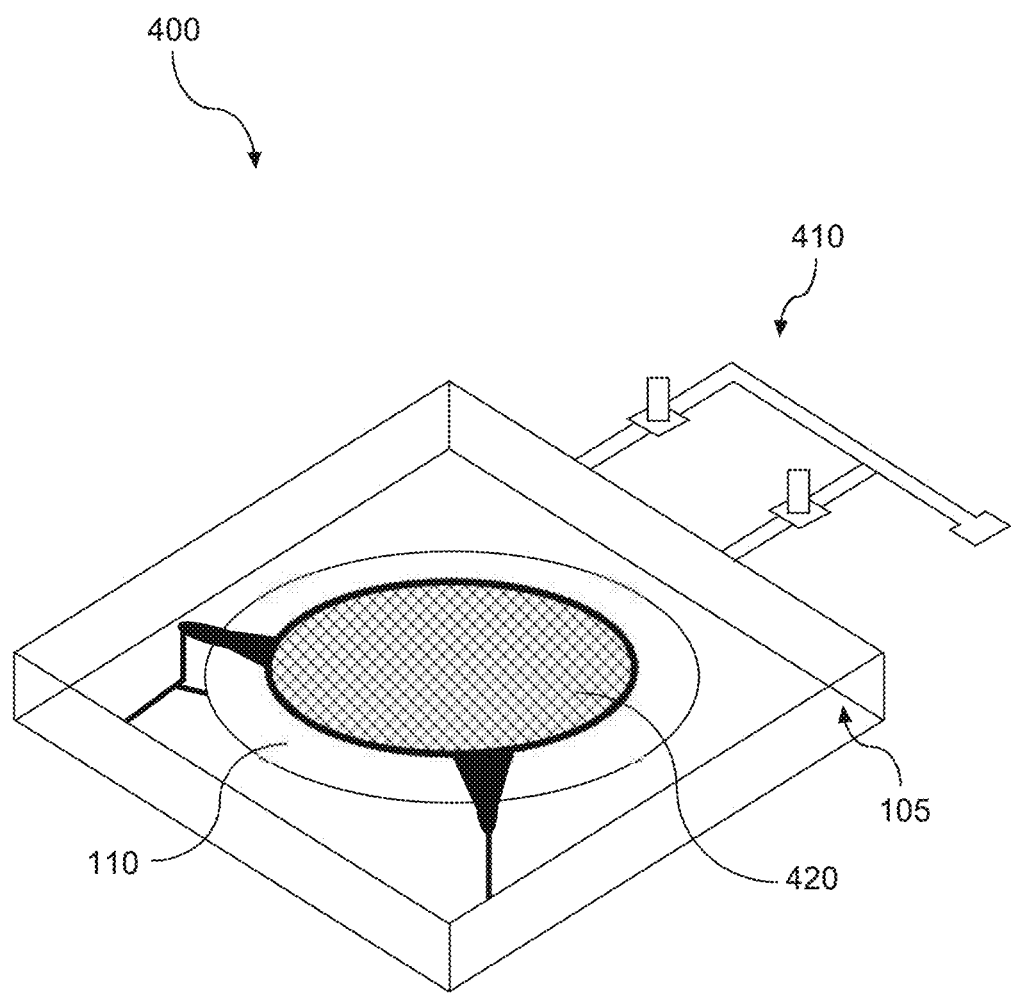
FIG. 4 depicts an example gas supply according to example embodiments of the present disclosure.

FIG. 4 depicts an example gas supply 400 according to example embodiments of the present disclosure. As illustrated, the gas supply 400 includes two gas inlets 410 and a gas flow plate 420. One gas inlet is used to deliver gas in a gas flow direction perpendicular to a workpiece 110, and the other gas inlet is used to deliver gas in a gas flow direction parallel to the workpiece 110. The gas flow plate 420 is located above the workpiece 110 such that gas can be delivered in a gas flow direction perpendicular to the workpiece 110 uniformly. For illustration, FIG. 4 shows that the workpiece 110 has a larger diameter than the diameter of the gas flow plate 420. In some embodiments, the diameter of the gas flow plate 420 can be smaller or approximately equal to the diameter of the workpiece 110.

Figure 5:
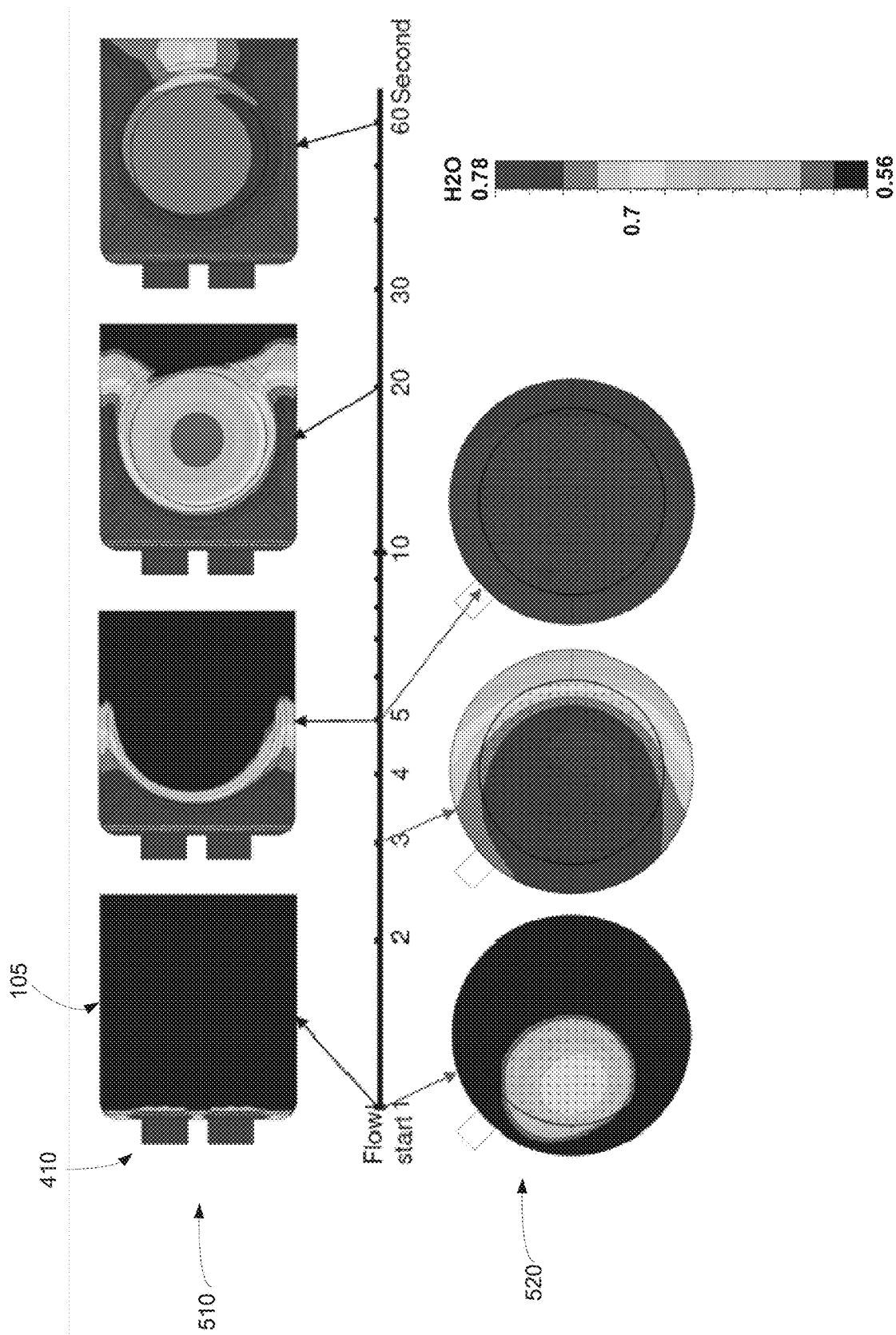
FIG. 5 depicts an example top view of a gas flowing into a thermal processing chamber according to example embodiments of the present disclosure.

FIG. 5 depicts an example top view of a gas flowing into a thermal processing chamber 105 according to example embodiments of the present disclosure. The upper row 510 shows that a gas (e.g., a forming gas and an oxygen containing gas) is delivered in a gas flow direction parallel to a workpiece. The gas is delivered into the thermal processing chamber 105 from a side of the chamber. When time increasing from 1 second to 60 seconds, a concentration of water vapor in the thermal processing chamber 105 becomes more and more uniform. The bottom row 520 shows that the gas is delivered in the gas flow direction parallel to the workpiece, and in a gas flow direction perpendicular to the workpiece. As can be seen in FIG. 5, a concentration of water vapor becomes more uniform at a faster speed than the upper row 510.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
   placing the workpiece in a thermal processing chamber;
   admitting a first gas into the thermal processing chamber at a first flow rate, the thermal processing chamber being at approximately atmospheric pressure, the first gas comprising a mixture of an inert gas and a hydrogen gas, a concentration of the hydrogen gas in the mixture being less than about 4% by volume;
   admitting a second gas into the thermal processing chamber, the second gas comprising oxygen at a second flow rate;
   heating the workpiece in the thermal processing chamber with one or more heat sources; and
   exposing the workpiece to the first gas and the second gas in the thermal processing chamber at approximately atmospheric pressure to at least partially oxidize a portion of the workpiece;
   wherein the first flow rate is such that a partial pressure of the hydrogen gas in the thermal processing chamber is less than about 10 Torr;
   wherein the second flow rate is such that a partial pressure of the oxygen in the thermal process chamber is in a range of about 30 Torr to about 50 Torr.

2. The method of claim 1, wherein the inert gas comprises an argon gas, the concentration of the hydrogen gas in the mixture is less than about 3% by volume.

3. The method of claim 1, wherein the inert gas comprises a nitrogen gas, the concentration of the hydrogen gas in the mixture is less than about 4% by volume.

4. The method of claim 1, wherein a total flow rate of the first flow rate and the second flow rate is less than about 350 slm.

5. The method of claim 1, further comprising admitting a dilution gas into the thermal processing chamber, the dilution gas configured to dilute the first gas and the second gas.

6. The method of claim 5, wherein the dilution gas is different from the inert gas in the first gas.

7. The method of claim 1, further comprising admitting a third gas into the thermal processing chamber, the third gas comprising an ammonia gas.

8. The method of claim 1, wherein heating the workpiece further comprises heating a first surface and an opposing second surface of the workpiece with the one or more heat sources.

9. The method of claim 1, wherein a water vapor generated by a reaction between the first gas and the second gas at approximately atmospheric pressure is dissociated to at least partially oxidize the portion of the workpiece.

10. The method of claim 1, wherein the first gas is admitted into the thermal processing chamber in a gas flow direction perpendicular to the workpiece.

* * * * *